(12) United States Patent
Ye et al.

(10) Patent No.: US 11,796,349 B2
(45) Date of Patent: Oct. 24, 2023

(54) CAPACITIVE SENSOR CHIP BASED ON POWER-AWARE DYNAMIC CHARGE-DOMAIN AMPLIFIER ARRAY

(71) Applicant: HANG ZHOU NANO CORE CHIP ELECTRONIC TECHNOLOGY CO.,LTD, Hangzhou (CN)

(72) Inventors: Le Ye, Hangzhou (CN); Heyi Li, Hangzhou (CN); Ru Huang, Hangzhou (CN); Yuanxin Bao, Hangzhou (CN); Hao Zhang, Hangzhou (CN)

( * ) Notice: Subject to any disclaimer, the term of this patent is extended or adjusted under 35 U.S.C. 154(b) by 0 days.

(21) Appl. No.: 17/751,837

(22) Filed: May 24, 2022

(65) Prior Publication Data

US 2022/0381587 A1 Dec. 1, 2022

(30) Foreign Application Priority Data

May 25, 2021 (CN) .......................... 202110572564.2

(51) Int. Cl.
*G01D 5/24* (2006.01)
*G01R 27/26* (2006.01)
*H03F 3/70* (2006.01)

(52) U.S. Cl.
CPC ........... *G01D 5/24* (2013.01); *G01R 27/2605* (2013.01); *H03F 3/70* (2013.01)

(58) Field of Classification Search
CPC .. G01D 5/00; G01D 5/12; G01D 5/14; G01D 5/24; G01R 27/00; G01R 27/02;
(Continued)

(56) References Cited

U.S. PATENT DOCUMENTS 9,534,973 B2 * 1/2017 McTighe .................. G01L 9/12

FOREIGN PATENT DOCUMENTS

CN 1801568 A * 7/2006 ............. Y02E 40/30
CN 104833823 A * 8/2015 ............ G01P 15/125

* cited by examiner

*Primary Examiner* — Hoai-An D. Nguyen
(74) *Attorney, Agent, or Firm* — TIANCHEN LLC.; Yuan R. Li; Yi Fan Yin

(57) ABSTRACT

Disclosed is a capacitive sensor chip based on a power-aware dynamic charge-domain amplifier array. The capacitive sensor chip is based on a zoom architecture and includes: an architecture having two or more stages for capacitive quantization in which a first stage performs coarse quantization using a successive approximation register (SAR) and a second stage performs fine quantization using a delta-sigma modulator, an amplifier in the capacitive sensor chip is powered by a floating capacitor, the floating capacitor is connected to a power supply to being charged and connected to the amplifier to power the amplifier by controlling switches; a first-order integrator of the delta-sigma modulator includes an amplifier array having a scale of N bits and $2^N$ amplifiers where N is a positive integer. By the capacitive sensor chip based on the power-aware dynamic charge-domain amplifier array, utilization efficiency of charges can be effectively improved, power consumption overheads nay be effectively saved, energy efficiency of a system is greatly improved and a driving capability of the subsequent-stage amplifier may be adaptively distributed according to the size of an input capacitance.

9 Claims, 2 Drawing Sheets

(58) Field of Classification Search
CPC ....... G01R 27/26; G01R 27/2605; H03F 3/00; H03F 3/38; H03F 3/387; H03F 3/393; H03F 3/45; H03F 3/45071; H03F 3/45076; H03F 3/45179; H03F 3/45632; H03F 3/68; H03F 3/70; H03F 3/72; H03F 1/00; H03F 1/02; H03F 1/0205; H03F 1/0277; H03F 1/30; H03F 1/301; H03F 1/303; H03F 1/304; H03F 2200/00; H03F 2200/271; H03F 2200/331
USPC .......................................... 324/600, 649, 658
See application file for complete search history.

CAPACITIVE SENSOR CHIP BASED ON POWER-AWARE DYNAMIC CHARGE-DOMAIN AMPLIFIER ARRAY

The present disclosure claims the priority of Chinese patent application under CN202110572564.2 filed on May 25, 2021. The contents of the aforementioned application are incorporated herein by reference in its entirety.

TECHNICAL FIELD

The present application relates to the technical field of integrated circuits, and in particular, to a capacitive sensor chip based on a power-aware dynamic charge-domain amplifier array.

BACKGROUND

In the era of the Internet of Things (IoT), the IoT technique is mainly divided into three layers of a sensing layer, a transport layer and a computing layer. The sensing layer is mainly responsible for collecting physical signals in the environment with high energy efficiency and high precision. There are many kinds of physical signals, such as: humidity, pressure, acceleration, displacement, temperature, etc. If these sensor chips are to be widely deployed at IoT nodes, deployment costs and post-maintenance costs need to be considered since the limited battery capacity places higher requirements on the overall power consumption of the sensor chips. As energy-efficient and low-cost sensing schemes, capacitive sensors are widely used in various sensing scenarios, such as humidity, pressure, acceleration, and displacement sensing. Traditional capacitive sensors include SAR-based capacitance-to-digital converter (SAR-based CDC), DSM-based capacitance-to-digital converter (ΔΣ-based CDC), frequency-locked loop-based capacitance-to-digital converter (FLL-based CDC), and zoom-based capacitance-to-digital converter (Zoom-based CDC). Among them, SAR-based CDC usually has higher energy efficiency, but is low in conversion resolution, which is limited by insufficient precision in practical sensing applications. Although ΔΣ-based CDC has high conversion resolution, an integrator usually requires an amplifier with a high energy consumption, which deteriorates energy efficiency. Although FLL-based CDC also has high accuracy, an active filter and bias circuits in the loop consumes a large amount of power, thereby deteriorating energy efficiency. The traditional zoom capacitance-to-digital converter has large redundancy, and the delta-sigma modulator is designed based on the maximum capacitance input, the energy efficiency will be deteriorated in the case of a small input signal and a balance need to be made between energy efficiency and dynamic range. Therefore, there is an urgent need for a capacitive sensor chip technique with high energy efficiency, high precision, and large dynamic range, which is compatible with different types of sensors while ensuring energy efficiency, thereby promoting the application of capacitive sensor chips in ultra-low-power IoT scenarios.

SUMMARY

In order to solve the technical problem that the related art cannot meet a need of a capacitive sensor chip with high energy efficiency, high precision and large dynamic range, the present application provides a capacitive sensor chip, which is based on a zoom architecture and includes:

an architecture having two or more stages for capacitive quantization in which a first stage performs coarse quantization using a successive approximation register (SAR) and a second stage performs fine quantization using a delta-sigma modulator, and a power-aware module, configured to output a control code for controlling power consumption overheads of a subsequent-stage fine quantization circuit after an input is coarsely quantized by a previous stage of the capacitive sensor chip, an amplifier in the capacitive sensor chip is powered by a floating capacitor, the floating capacitor is connected to a power supply to being charged and connected to the amplifier to power the amplifier by controlling switches; a first-order integrator of the delta-sigma modulator includes an amplifier array having a scale of N bits and $2^N$ amplifiers where N is a positive integer.

In order to solve the above technical problems, the present application further provides a capacitive sensor chip, the capacitive sensor chip is based on a zoom architecture, and includes:

two differential capacitance quantization loops connected in parallel, one of which is configured to input a positive excitation, and the other configured to input a negative excitation, each of the two differential capacitance quantization loops being provided with an architecture having two or more stages for capacitive quantization in which a first stage performs coarse quantization using a successive approximation register (SAR) and a second stage performs fine quantization using a delta-sigma modulator, and a power-aware module, configured to output a control code for controlling power consumption overheads of a subsequent-stage fine quantization circuit after an input is coarsely quantized by a previous stage of the capacitive sensor chip, an amplifier in the capacitive sensor chip is powered by a floating capacitor, the floating capacitor is connected to a power supply to being charged and connected to the amplifier to power the amplifier by controlling switches; a first-order integrator of the delta-sigma modulator includes an amplifier array having a scale of N bits and $2^N$ amplifiers where N is a positive integer.

According to the capacitive sensor chip provided by the embodiment of the present application, by adopting not a delta-sigma modulator, which is different from the traditional static/dynamic amplifier, but an inverter amplifier powered by a high-efficiency floating capacitor, the utilization efficiency of charges can be effectively improved. Power consumption of an integrator in the delta-sigma modulator due to no common-mode feedback circuits, which greatly improve the energy efficiency of the system. In order to increase the input dynamic range, the zoom architecture is used in which the first stage coarsely quantize in input using a SAR CDC and a subsequent delta-sigma modulator is used for subsequent fine quantization. Further, a driving capability of the subsequent-stage amplifier may be adaptively distributed according to the size of an input capacitance using a method of a power-aware dynamic charge-domain amplifier array. The energy efficiency of the amplifier itself is already very high since the amplifier uses a charge-domain amplifier (that is, an amplifier powered by a floating capacitor) and the energy efficiency of the system can be further improved by the method of adaptively configuring power consumption.

BRIEF DESCRIPTION OF THE DRAWINGS

In order to illustrate embodiments of the present application or the technical solutions in the related art more clearly, drawings that need to be used in the embodiments and related art are briefly introduced. The drawings in the following description are some embodiments of the present application and other drawings can also be obtained based on these drawings without any creative efforts for those of ordinary skill in the art.

DETAILED DESCRIPTION

In order to make the objectives, technical and advantages of the present application clearer, the technical solutions in the embodiments of the present application will be clearly and completely described below with reference to the drawings in the embodiments of the present application. The described embodiments are a part but not all of the present application. All other embodiments obtained by those of ordinary skill in the art based on the embodiments of the present application without creative efforts shall fall within the protection scope of the present application.

In order to make the technical solutions of the present application clearer, the embodiments of the present application will be described in detail below with reference to the drawings.

Embodiment 1

Figure 1:
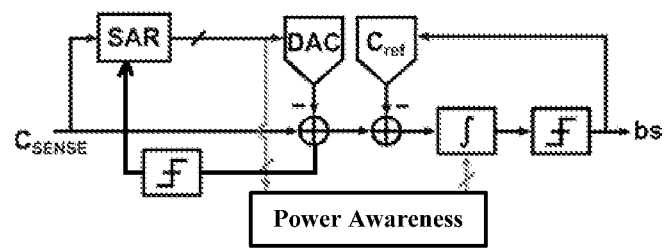
FIG. 1 shows a schematic diagram of a capacitive sensor chip according to Embodiment 1 of the present application.

As shown in FIG. 1, the present application provides a capacitive sensor chip, which is based on a zoom architecture and includes:

an architecture having two or more stages for capacitive quantization in which a first stage performs coarse quantization using a successive approximation register (SAR) and a second stage performs fine quantization using a delta-sigma modulator, and a power-aware module, configured to output a control code for controlling power consumption overheads of a subsequent-stage fine quantization circuit after an input is coarsely quantized by a previous stage of the capacitive sensor chip, an amplifier in the capacitive sensor chip is powered by a floating capacitor, the floating capacitor is connected to a power supply to being charged and connected to the amplifier to power the amplifier by controlling switches;

a first-order integrator of the delta-sigma modulator includes an amplifier array having a scale of N bits and $2^N$ amplifiers where N is a positive integer.

Further, the first stage includes:

a successive approximation register (SAR) unit, a first capacitor array DAC, a first comparator and an input sensing capacitance $C_{SENSE}$ to be measured connected in series.

Further, the second stage includes:

one or more integrators, a second comparator, and a second capacitor array or reference capacitor connected in series. The reference capacitor $C_{ref}$ is used for 1 bit digital-to-analog conversion.

Further, the reference capacitor $C_{ref}$ is an interdigital capacitor or a plate capacitor.

Figure 2:
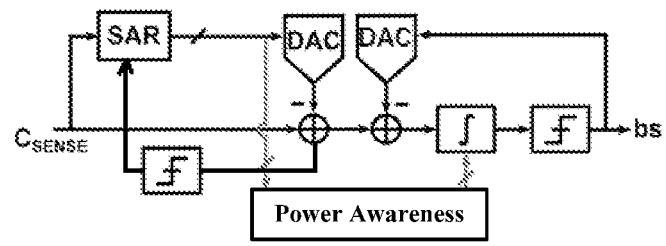
FIG. 2 shows a schematic diagram of another capacitive sensor chip according to Embodiment 1 of the present application.

In practical applications, the above-mentioned reference capacitor $C_{ref}$ that completes the digital-to-analog conversion can be replaced with a capacitor array DAC when multi-bit digital-to-analog conversion is performed, as shown in FIG. 2.

Further, the delta-sigma modulator is first-order, second-order or higher-order, wherein the order of the delta-sigma modulator represents a number of integrators connected in the second stage.

Further, the first comparator and the second comparator is a 1-bit comparators or a multi-bit comparator, and the first comparator and the second comparator are dynamic comparators or static comparators.

Further, the integrator consists of a differential inverter amplifier.

Specifically, an embodiment of the present application provides a capacitive sensor chip. FIG. 1 shows a system schematic diagram of the capacitive sensor chip. As shown in FIG. 1, the chip adopts a Zoom architecture, and the first stage is designed by a successive approximation register (SAR) and configured to quantize an input capacitance, which can effectively expand a dynamic range of the capacitive sensor and reduce an effect of the baseline capacitance. The DAC in the SAR loop is a capacitor array, which is configured to quantize the input capacitance $C_{SENSE}$, where a size of the DAC array and a size of the smallest capacitance unit are determined according to the design requirements. The simplest SAR ADC architecture can be used, or a corresponding improved version can be used. After the input is coarsely quantized by SAR CDC as the first stage, delta-sigma modulator as the second stage will further refine to improve the final conversion accuracy. The order of the delta-sigma modulator can be first order, second order, third order, fourth order or even higher order, which is selected according to the design requirements. An integrator in the delta-sigma modulator uses an inverter amplifier powered by a floating capacitor, which has the characteristics of dynamic charge-domain bias. After the amplification is completed, the transistor is automatically turned off due to automatic drop in voltage difference on the floating capacitor as a power supply, thereby saving power consumption. In addition, a common mode outputted by the amplifier is naturally stable due to the use of floating capacitor, and thus no common mode feedback circuits are required, which further saves power consumption. Compared with the traditional DC voltage-powered amplifier, it can significantly improve the utilization efficiency of charges and improve the energy efficiency of circuits and chip systems. The integrator designed based on the inverter amplifier powered by this floating capacitor has high energy efficiency and the core of this amplifier lies in that this amplifier is powered by the floating capacitor. The use of the inverter amplifier can further improve the energy efficiency, and the structure is relatively simple, and selected type of amplifier is not limited thereto and may even be a corresponding derivative version of the proposed structure. Likewise, the delta-sigma modulator designed based on such integrator are also extremely energy efficient, which can significantly reduce the power consumption of capacitive sensor chips designed based on the delta-sigma modulator, while maintaining high conversion accuracy and extremely short conversion time. In addition, the capacitive sensor chip also adopts a power-aware technique, which can make the subsequent-stage circuit adaptively allocate the optimal power consumption overhead according to the size of the input capacitance, so as to achieve the purpose of improving energy efficiency. The capacitive sensor chip coarsely quantizes the input signal through SAR CDC, and the output digital code can be used to control the power consumption of the subsequent delta-sigma modulators after being converted. The integrator of the amplifier array needs a strong current-driving capability when a large capacitor is input, and needs a weak current-driving capability when a small capacitor is input since the delta-sigma modulator uses an integrator of the dynamic charge-domain amplifier array (powered by the floating capacitor) and thus the power consumption should be allocated adaptively and dynamically according to the input to ensure that an optimum energy efficiency is reached over the entire dynamic range.

Figure 3:
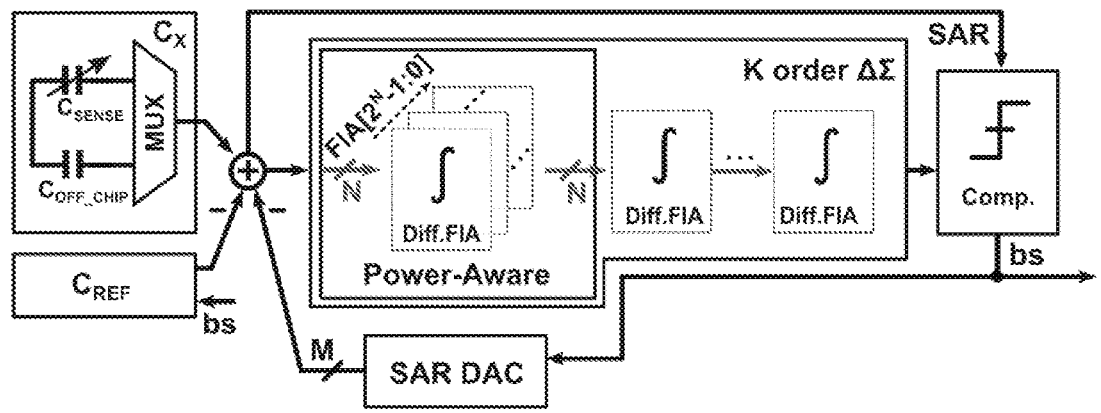
FIG. 3 shows a schematic diagram of a capacitive sensor chip according to Embodiment 1 of the present application.

From the application level of the capacitive sensor chip of the present application, as shown in FIG. 3 in the present embodiment, an input capacitance $C_X$ is selected from an on-chip input capacitance and an off-chip input capacitance using a multiplexer (MUX). The on-chip input capacitance $C_{SENSE}$ can be, but is not limited to, one or more on-chip input capacitances. In the same way, the off-chip input capacitance $C_{OFF-CHIP}$ can also be more capacitors. In the first stage, the input capacitance is coarsely quantized using a SAR ADC, where the SAR DAC is a set of capacitor arrays, and the DAC has M-bit capacitance units (M=1, 2, 3, 4, . . . ) for quantizing the input capacitance and to eliminate the baseline capacitance of the input capacitance. In subsequent stages, K-order (K=1, 2, 3, 4, . . . ) delta-sigma modulator is adopted and an integrator of the delta-sigma modulator is designed based on an inverter amplifier powered by a floating capacitor. The first-stage integrator is generally designed as an N-bit array (having $2^N$ amplifier/integrator units) in which a number of units turned on is determined by a size of the input capacitance to be quantized and the entire path adopts a pseudo-differential structure, which can effectively suppress the adverse effects of common mode noise. The comparators of the delta-sigma modulator loop and the SAR ADC can be either static or dynamic comparators, or an inverter amplifier powered by a floating capacitor can be used as the comparator of the pre-amplification stage. $C_{ref}$ in FIG. 3 is used as a reference capacitor of the delta-sigma modulator loop and the reference capacitor can be, but is not limited to, on-chip finger capacitors, on-chip plate capacitors, and the like. Finally, the delta-sigma modulator will output a series of bitstream (bs), and the size of the input capacitance can be parsed through digital filtering and post-processing. In FIG. 3, the comparator is shared by the first stage and the second stage. In a specific application, the first stage and the second stage can be used in a separate time through timing control.

Figure 4:
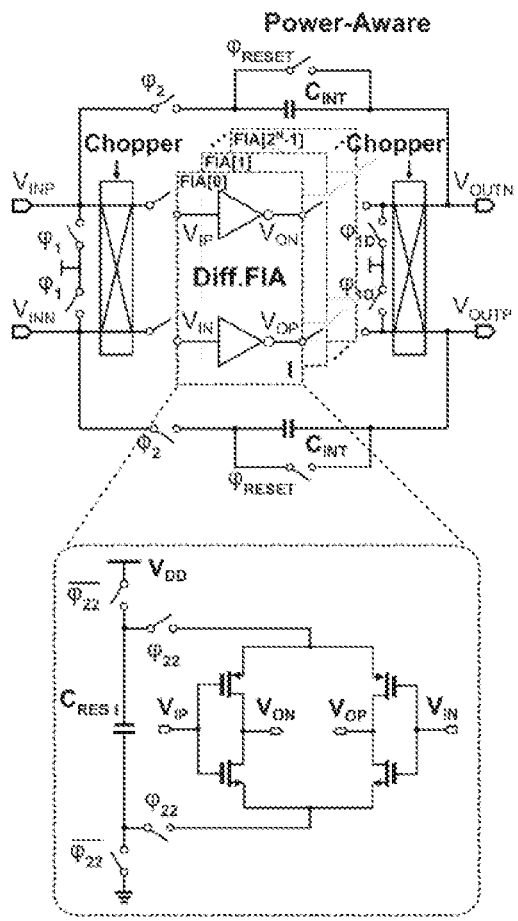
FIG. 4 shows a detailed circuit diagram of a dynamic charge-domain amplifier of the capacitive sensor chip according to Embodiment 1 of the present application.

As shown in FIG. 4, the dynamic charge-domain amplifier array (inverter amplifier array powered by the floating capacitor) in the present embodiment has a scale of N bits and $2^N$ amplifier units. A number of amplifier units connected to the delta-sigma modulator loop is determined by the size of the input capacitance. The larger the input capacitance, the larger the number of amplifier units connected, which can ensure that the amplifier input virtual ground can normally establish a steady state. The structure of the pseudo-differential amplifier is shown in FIG. 4 in which a CMOS complementary inverter structure is used. The differential inverter is powered by a floating capacitor. When the amplifier is not working, that is, when a switched capacitor is in the sampling phase, capacitor plates at both ends of the floating capacitor are connected to the power supply and ground, respectively by turning off a switch φ22 and turning on a switch $\overline{\phi_{22}}$, to ensure that the capacitor is fully charged by the power supply. When the amplifier is working, the amplifier is powered by the power supply capacitor by turning off the switch $\overline{\phi_{22}}$ and turning on the switch φ22. With the progress of amplification/integration, the voltage drop on the floating power supply capacitor will gradually decrease. When the amplification/integration is basically completed, the voltage across the power supply capacitor is too high small and thus the current of the transistor is automatically cut off, thereby saving power consumption overheads. The output common mode voltage is naturally stable due to the power supply of the floating capacitor, and no additional common mode feedback circuit is required. In addition, offset and 1/f noise of the first-stage amplifier can be suppressed to a certain extent by adding a chopper since the delta-sigma modulator is sensitive to them.

In the embodiment of the present application, the utilization efficiency of charges in the signal path may be effectively improved by adopting a technique based on a power-aware dynamic charge-domain amplifier array (powered by a floating capacitor). Since the amplifier array has the characteristics of dynamic charge-domain bias, after the amplification is completed, the transistor is automatically turned off due to automatic drop in voltage difference on the floating capacitor as a power supply, thereby saving power consumption. In addition, a common mode outputted by the amplifier is naturally stable due to the power supply of floating capacitor, and thus no common mode feedback circuits are required, which further saves power consumption overheads. Compared with the traditional DC voltage-powered amplifier, it can significantly improve the utilization efficiency of charges and improve the energy efficiency of circuits and chip systems. The core of this amplifier lies in the power supply of the floating capacitor. The use of an inverter amplifier can further improve the energy efficiency, and the structure is relatively simple. However, the selected type of the amplifier is not limited thereto, and it can even be a corresponding derivative version of the proposed structure. In addition, by adopting a power-aware technique in the capacitive sensor chip, it can make the subsequent-stage circuit adaptively allocate the optimal power consumption overhead according to the size of the input capacitance, so as to achieve the purpose of improving energy efficiency. The capacitive sensor chip coarsely quantizes the input signal through SAR CDC, and the output digital code can be used to control the power consumption of the subsequent delta-sigma modulators after being converted. The integrator of the amplifier array needs a strong current-driving capability and the number of turned-on amplifier units is enormous when a large capacitor is input, and needs a weak current-driving capability and the number of turned-on amplifier units is less when a small capacitor is input since the delta-sigma modulator uses an integrator of the dynamic charge-domain amplifier array (powered by the floating capacitor) and thus the power consumption should be allocated adaptively and dynamically according to the input to ensure that an optimum energy efficiency is reached over the entire dynamic range. The high-efficiency capacitive sensor chip, due to its extremely high energy efficiency indicators, can play a greater role in the future Internet of Things, artificial intelligence, integrated storage and computing chips, communication chips, biological sensor chips, sensor chips and other fields.

Embodiment 2

Figure 5:
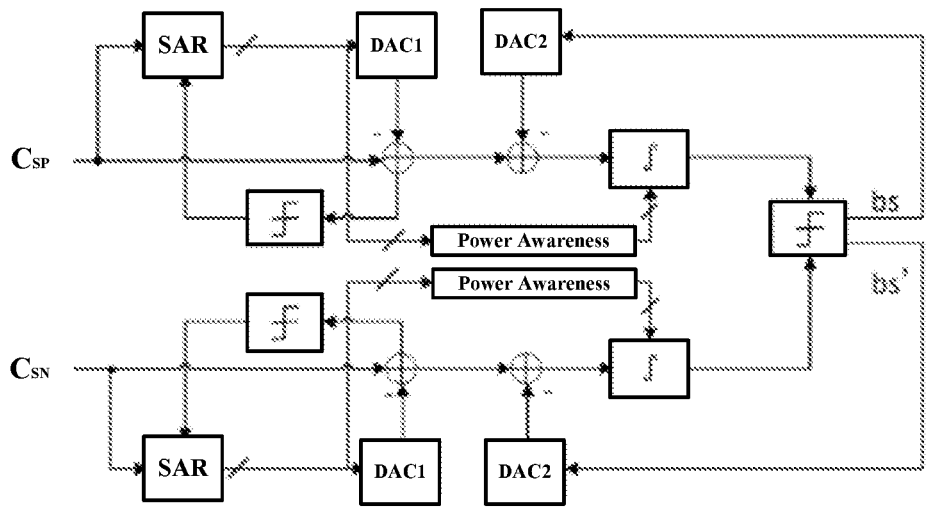
FIG. 5 shows a schematic diagram of a capacitive sensor chip according to Embodiment 2 of the present application.

As shown in FIG. 5, the present disclosure further provides a capacitive sensor chip being based on a zoom architecture and including:

two differential capacitance quantization loops connected in parallel, one of which is configured to input a forward excitation, and the other configured to input a negative excitation, each of the two differential capacitance quantization loops being provided with an architecture having two or more stages for capacitive quantization in which a first stage performs coarse quantization using a successive approximation register (SAR) and a second stage performs fine quantization using a delta-sigma modulator, and a power-aware module, configured to output a control code for controlling power consumption overheads of a subsequent-stage fine quantization circuit after an input is coarsely quantized by a previous stage of the capacitive sensor chip, an amplifier in the capacitive sensor chip is powered by a floating capacitor, the floating capacitor is connected to a power supply to being charged and connected to the amplifier to power the amplifier by controlling switches; a first-order integrator of the delta-sigma modulator includes an amplifier array having a scale of N bits and $2^N$ amplifiers where N is a positive integer.

The difference between Embodiment 2 shown in FIG. 5 and Embodiment 1 shown in FIG. 1 is that two capacitance quantization circuits are used, and the second-stage quantization pressure may be relieved by using a two capacitance quantization circuits structure.

Structures and functions of respective modules in the first stage in the embodiment shown in FIG. 5 are similar to those of the corresponding modules in the first stage in Embodiment 1 shown in FIG. 1 and similarly, structures and functions of respective modules in the second stage in the embodiment shown in FIG. 5 are similar to those of the corresponding modules in the second stage in Embodiment 1 shown in FIG. 1 and will not be described in detail herein.

A technique of the capacitive sensor chip based on the power-aware dynamic charge-domain amplifier array proposed by the present application may be widely used in the field of capacitance-to-digital converter, such as humidity sensors, pressure sensors, acceleration sensors, displacement sensors, gyroscope, electronic skin, touch sensor, etc. The technique is extremely suitable for application scenarios that require ultra-low power consumption and can accelerate the development of IoT chips, artificial intelligence chips, integrated storage and computing chips, communication chips, biological sensor chips, sensor chips and other fields since it significantly improves the energy efficiency level of the chip.

It should be noted that the above embodiments are only used to explain the technical solutions of the present application, and are not limited thereto. Although the present application is described in detail with reference to the foregoing embodiments, it should be understood by those skilled in the art that the technical solutions described in the foregoing embodiments may be modified and equivalent replacements are made to a part of the technical features and these modifications and substitutions do not depart from scopes of the technical solutions of the embodiments of the present application.

What is claimed is:

1. A capacitive sensor chip based on a power-aware dynamic charge-domain amplifier array, the capacitive sensor chip being based on a Zoom architecture and comprising:

an architecture having two or more stages for capacitive quantization in which a first stage performs coarse quantization using a successive approximation register (SAR) and a second stage performs fine quantization using a delta-sigma modulator, and a power-aware module, configured to output a control code for controlling power consumption overheads of a subsequent-stage fine quantization circuit after an input is coarsely quantized by a previous stage of the capacitive sensor chip, wherein an amplifier in the capacitive sensor chip is powered by a floating capacitor, the floating capacitor is connected to a power supply to being charged and connected to the amplifier to power the amplifier by controlling switches; a first-order integrator of the delta-sigma modulator includes an amplifier array having a scale of N bits and $2^N$ amplifiers where N is a positive integer.

2. The capacitive sensor chip of claim 1, wherein the first stage comprises:

a successive approximation register unit, a first capacitor array, a first comparator and an input sensing capacitance to be measured connected in series.

3. The capacitive sensor chip of claim 2, wherein the first comparator is a 1-bit comparator or a multi-bit comparator, and the first comparator is a dynamic comparator or a static comparator.

4. The capacitive sensor chip of claim 1, wherein the second stage comprises:

one or more integrators, a second comparator, and a second capacitor array or reference capacitor connected in series.

5. The capacitive sensor chip of claim 4, wherein the second comparator is a 1-bit comparator or a multi-bit comparator, and the second comparator is a dynamic comparator or static comparator.

6. The capacitive sensor chip of claim 4, wherein the reference capacitor is an interdigital capacitor or a plate capacitor.

7. The capacitive sensor chip of claim 4, wherein the delta-sigma modulator is first-order, second-order or higher-order, wherein the order of the delta-sigma modulator represents a number of integrators connected in the second stage.

8. The capacitive sensor chip of claim 4, wherein the integrator consists of a differential inverter amplifier.

9. A capacitive sensor chip being based on a Zoom architecture, comprising:

two differential capacitance quantization loops connected in parallel, one of which is configured to input a positive excitation, and the other configured to input a negative excitation, each of the two differential capacitance quantization loops being provided with an architecture having two or more stages for capacitive quantization in which a first stage performs coarse quantization using a successive approximation register (SAR) and a second stage performs fine quantization using a delta-sigma modulator, and a power-aware module, configured to output a control code for controlling power consumption overheads of a subsequent-stage fine quantization circuit after an input is coarsely quantized by a previous stage of the capacitive sensor chip, wherein an amplifier in the capacitive sensor chip is powered by a floating capacitor, the floating capacitor is connected to a power supply to being charged and connected to the amplifier to power the amplifier by controlling switches; a first-order integrator of the delta-sigma modulator includes an amplifier array having a scale of N bits and $2^N$ amplifiers where N is a positive integer.

\* \* \* \* \*